United States Patent [19]
Beck et al.

[11] 3,944,800
[45] Mar. 16, 1976

[54] MEMORY DIAGNOSTIC ARRANGEMENT
[75] Inventors: Frank Valentine Beck, Clark; David Cartwright Peterson, Neptune, both of N.J.; Edward Myron Prell, St. Charles, Ill.; Terrence Thomas Quin, Holmdel, N.J.
[73] Assignee: Bell Telephone Laboratories, Incorporated, Murray Hill, N.J.
[22] Filed: Aug. 4, 1975
[21] Appl. No.: 601,522

[52] U.S. Cl. .................... 235/153 AM; 235/153 AE; 340/174 ED
[51] Int. Cl.² ................. G11C 29/00; H03K 13/34; G06F 11/10
[58] Field of Search ............. 235/153 AE, 153 AM; 340/174 ED

[56] References Cited
UNITED STATES PATENTS

3,599,146 8/1971 Weisbecker ................. 235/153 AM
3,814,922 6/1974 Nibby et al. ................. 235/153 AK

Primary Examiner—R. Stephen Dildine, Jr.
Attorney, Agent, or Firm—J. W. Falk; M. S. Landis

[57] ABSTRACT

A diagnostic system is disclosed for detecting malfunctions in the access circuitry utilized to control the reading, writing, and refreshing of a plurality of semiconductor memory modules. More specifically, a pair of access circuits are provided for each module with each access circuit only controlling the accessing of predetermined bits of each word stored in that module. During read or write operations, the output signals generated by each of the two access circuits for application to the memory elements in that module are "compared" to ensure that the memory elements are being properly accessed. During refresh operations, the outputs of each pair of access circuits are also "matched" to ensure the integrity of the refresh operation.

12 Claims, 10 Drawing Figures

FIG. 3
MEMORY PLANE

MEMORY DIAGNOSTIC ARRANGEMENT

FIELD OF THE INVENTION

This invention pertains to diagnosing memories and, more specifically, to diagnosing access circuitry utilized to control access to the memory storage elements. Even more specifically, this invention pertains to diagnosing the operability of semiconductor memories during reading, writing, and refreshing operations.

BACKGROUND OF THE INVENTION AND PRIOR ART

In recent years tremendous technological strides have been made in the area of high capacity memory storage. Such strides are best illustrated by semiconductor memory systems utilizing field effect transistors to store information therein in the form of capacitive charges. Such memories have great potential for use in inexpensive large capacity memory systems due to their small size, low power consumption and ease of fabrication as integrated circuits. However, this type of memory suffers from the disadvantage that the capacitive storage of information is essentially volatile and, accordingly, must be periodically restored or refreshed in order to maintain the viability of the stored information. Moreover, because such memories are often formed by combining a plurality of chips into arrays to form a plurality of memory planes, numerous decoders are required to indicate the column and row of the desired chip as well as the column and row of the desired cell in the chip to which access is desired. Because of the complexity of the semiconductor memories, the access circuits utilized to control access to the memories are also hard to diagnose. However, to ensure the operability of a semiconductor memory system, effective diagnosis must be made of the control circuitry therein to ensure that such control circuitry is applying the proper control signals to the semiconductor memory arrays. Several prior art arrangements as discussed below have been designed to diagnose such memories.

In one prior art arrangement as disclosed in J. A. Weisbecker U.S. Pat. No. 3,599,146, issued Aug. 10, 1971, each word stored in the semiconductor memory contained a parity bit indicating the parity over the address at which that word was stored. By first computing the actual parity over the outputs from the address register, and then by comparing that computed parity with the parity bit in the retrieved word, it could be ascertained whether the memory had been accessed at the proper address. This arrangement appears to be effective; however, the use of the memory for storage of additional diagnostic information is costly and the arrangement is limited to detecting addressing errors.

In another prior art arrangement disclosed in C. M. Nibby U.S. Pat. No. 3,814,922, issued June 4, 1974, a maintenance status register and associated apparatus were utilized to identify and store information relating to errors arising in a semiconductor memory module. This arrangement produced error correcting code signals for stored information, which code signals were also stored in the memory module. These stored error correcting code signals were then combined with the information signals to form a group of location identifying signals. This arrangement appears to be effective but like the abovementioned Weisbecker arrangement, the storage of diagnostic information is costly and, moreover it appears that complicated logic operations are required to detect malfunctions.

It is an object of this invention to perform effective and thorough, yet simple, diagnostic operations on the access circuits utilized to acess memory elements without storing any related diagnostic information in the memory; however, diagnostic information such as parity information may still be stored in the memory for use in other diagnostic operations.

It is a further object of this invention to perform such diagnostics on a noninterfering basis so that the error-free operation of the access circuits is verified without interfering with normal memory utilization.

It is a further object of this invention to use the refresh operation in semiconductor memories as a diagnostic tool.

SUMMARY OF THE INVENTION

The access circuitry for each memory module is duplicated so that a pair of access circuits are jointly utilized to access words in a memory module. Thus, for example, if a module stores 48-bit words, one access circuit controls the accessing of predetermined bits of each of the words (e.g., bits 0, 1, 4, 5, 8, 9 ... 44, 45) while the other access circuit controls the accessing of the remaining bits in each word (e.g., bits 2, 3, 5, 7 .. . 46, 47). Thus, for each addressed word, one access circuit accesses half the bits of that word, while concurrently the other access circuit accesses the remaining bits of the word.

In accordance with one of the principles of this invention, during a read or write operation on one module, the control signals output from each of the access circuits in that one module are compared to ensure that the module is being accessed properly and particularly that the memory "halves" are being accessed at the same address. Thus in accordance with one aspect of out invention, duplicated access circuitry is provided for each memory module and the outputs of such duplicated circuitry are compared during read and write operations to ensure that the memory module is being properly accessed.

In this one illustrative embodiment of our invention, a semiconductor memory is disclosed in which information in each of the memory cells therein must be periodically refreshed to maintain the viability of the stored information. Accordingly, groups of cells in each chip in each of a plurality of memory modules are periodically refreshed. For each refresh operation, the outputs of each pair of the above-mentioned access circuits, which are also utilized to control the refresh operation, are compared to ensure that each memory module is being properly accessed for refresh. This is a powerful diagnostic tool because the operability of the access circuits in each memory module is verified periodically during each refresh operation without interfering with the refresh operation itself.

Thus, in accordance with another aspect of our invention, the refresh operation is utilized as a diagnostic tool in which the outputs of the duplicated access circuits in each module are compared to ensure the operability of such circuits.

BRIEF DESCRIPTION OF THE DRAWING

The foregoing as well as other objects, features, and advantages of our invention will be more apparent from a description of the drawing in which:

FIGS. 5–9 when combined as shown in FIG. 10 illustrate the detailed structure in the one illustrative embodiment of my invention generalized in FIG. 4.

More specifically.

FIG. 9 illustrates circuitry for controlling the specific timing points at which "mismatch error signals" can be generated; and FIG. 10 illustrates the manner in which FIGS. 5–9 are to be arranged.

GENERAL DESCRIPTION

Figure 1:
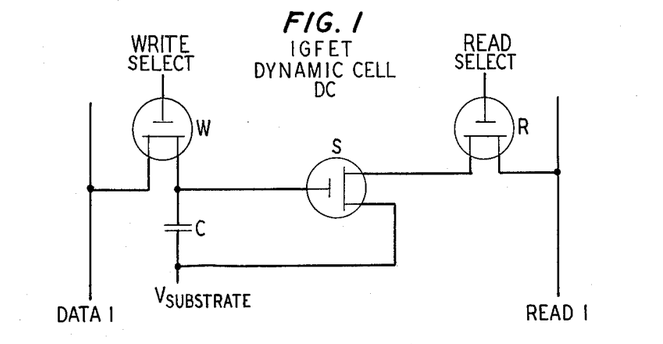
FIG. 1 illustrates the circuit diagram of an IGFET dynamic memory cell.

FIG. 1 illustrates the basic IGFET dynamic memory cell DC. Cell DC comprises three field effect transistors designated W, S, and R. Transistor W is associated with writing, transistor R is associated with reading, and transistor S is associated with the storage of the information in the cell. This information is stored in the form of a charge or lack of charge on capacitance C. This capacitance is parasitic on transistor S. To write into the cell, information is placed on access lead DATA1 and transistor W is switched on utilizing the WRITE SELECT input. This charges or discharges capacitance C to a voltage equal to that of the information signal. If capacitance C is charged to a voltage of −V, transistor S is switched on, otherwise transistor S is off. The information content of the cell can be read simply by switching on transistor R utilizing the READ SELECT lead and then sensing the impedance of transistor S over lead READ1.

The charge on capacitance C gradually leaks off and unless the cell is rewritten periodically the stored information will be lost. As described more fully hereinafter, each cell is refreshed every 1.92 ms.

In order to facilitate the understanding of the concepts of our invention, the structure of the IGFET memory cell and its organization on chips and finally on memory planes will be described only to the extent necessary to understand our invention. For further reference to the intricacies of the cell and its organization on chips, reference can be made, for example, to J. T. Koo, application Ser. No. 518,636, filed Oct. 29, 1974. The above-described FIG. 1 corresponds to FIG. 2 in the Koo application.

Figure 2:
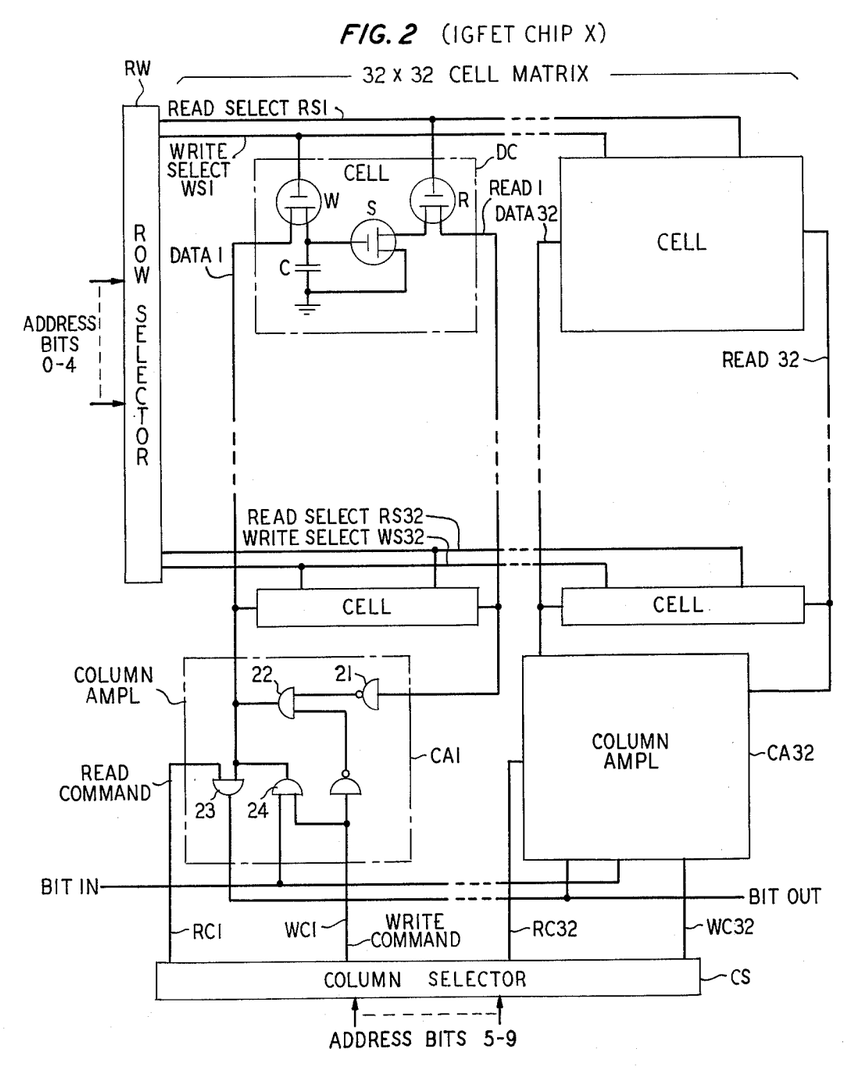
FIG. 2 illustrates how the IGFET memory cells of FIG. 1 are organized in a matrix to form an IGFET memory chip and also illustrates the various circuitry utilized to access the information stored on the chip.

FIG. 2 illustrates how the IGFET cells such as DC are arranged in a 32 × 32 cell matrix to form IGFET chip X. Row selectors RW and column selector CS are provided to selectively control the accessing of individual cells during read, write, and refresh operations. More specifically, address bits 0–4 are decoded to select the horizontal cell row, and address bits 5–9 are decoded to select the appropriate column. The manner in which cell DC is accessed for read and write operations will now be briefly described by way of an example of how an individual cell is accessed. For a read operation, read select lead RS1 is lowered to its ON level so that the information stored in the cell appears on lead READ1. This information is inverted by gate 21 and applied through gate 22 to gate 23. Read command lead RC1 then goes HIGH to gate the information onto lead BITOUT. It should be noted that information was read from each of the cells in the first row of the chip when the voltage of lead RS1 was lowered and by selectively enabling the appropriate read command lead RC1–RC32 the information from the desired cell was placed on lead BITOUT.

To write into cell DC, the bit to be stored is placed on lead BITIN and then write command lead WC1 is enabled to energize gate 24 so that the data bit is applied to lead DATA1. Write select lead WS1 is then enabled so that the information on lead DATA1 is stored in capacitance C.

As mentioned previously, each IGFET cell must be periodically refreshed to maintain proper capacitance C for each cell. This is accomplished by refreshing a row of cells at the same time. Thirty-two refresh operations are required to refresh an IGFET chip because each chip has 32 rows of cells. More specifically, to refresh a row of IGFET cells, the corresponding read select lead such as lead RS1 is first lowered to its ON level. The information stored in each cell appears on its respective read lead such as lead READ1 or READ32. The output from each cell is then inverted by its column amplifier such as amplifier CA1 or CA32 and applied to the appropriate data lead such as lead DATA1 or DATA32.

After the complemented output has settled on the data leads DATA1–DATA32, write select lead WS1 is lowered and the data signal voltage on each of the data leads is transferred to the respective capacitances C in each cell in the first row. The select signals are then returned to their idle level. It should be noted that a row is refreshed each time a cell therein is accessed for a read or write operation. Thus, refresh operations for particular rows may not be required if the cells in these rows are being actively interrogated.

The above-described IGFET chip may be, for example, the chip shown on FIGS. 1A and 1B, of the above-mentioned Koo application. The various read, write, and refresh operations are described in greater detail in the Koo application. Other figures therein illustrate the column amplifiers and describe the generation of internal timing signals utilized in accessing the chip.

Figure 3:
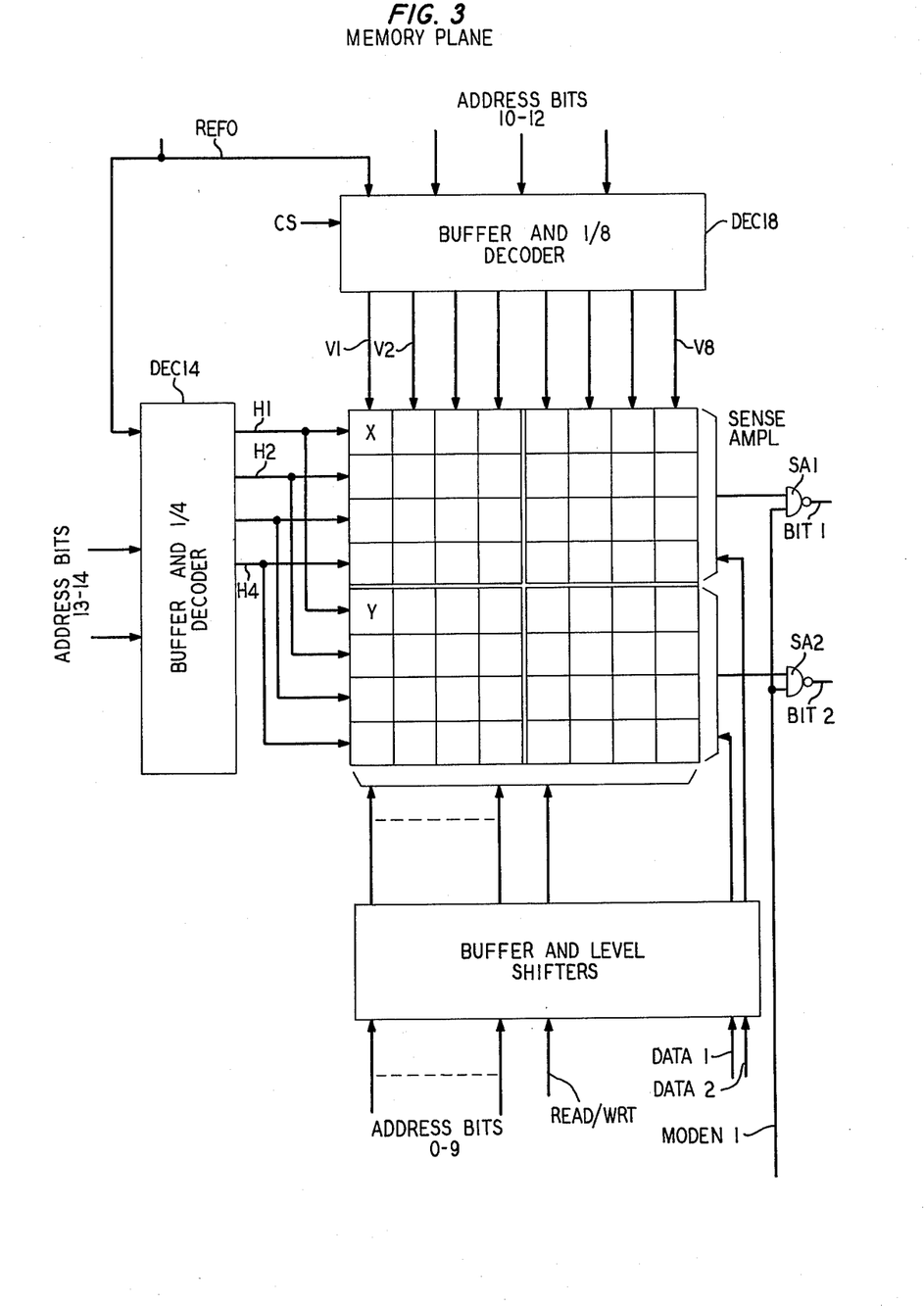
FIG. 3 illustrates how the IGFET memory chips of FIG. 2 are organized into memory planes.

FIG. 3 illustrates the manner in which the chips shown in FIG. 2 are combined to form a memory plane. More specifically the 1,024-bit chips are organized into an 8 × 8 matrix. The designation X in FIG. 3 indicates the location of IGFET chip X shown in FIG. 2. Of course this chip is identical to each of the other chips in the plane and could have been located anywhere in the matrix. The depicted memory plane stores 32,768 2-bit words. As shown in FIG. 3 1 bit is retrieved from the upper half of the memory plane and output through sense amplifier SA1 and the second bit is retrieved from the lower half of the memory plane and output through sense amplifier SA2. Thus, for a normal read or write operation, one chip in the upper half plane will be selected for access thereto and one chip in the lower half plane will be selected for access thereto.

More specifically, address bits 10–12 are decoded by one-out-of-eight decoder DEC18 to select a column, and address bits 13 and 14 are decoded by one-out-of-four decoders DEC14 to select a row. Thus, decoder DEC18 enables one of its output leads V1–V8 to select a column of cells, and decoder DEC14 enables one of its output leads H1–H4 to select a row in each half plane. The cell in each half plane at the intersection of the enabled leads is thereby selected.

As mentioned previously in regard to FIG. 2, address bits 0–9 are decoded to select the cell in each chip to be accessed. Thus in summary, first two chips on a memory plane are selected at the intersection of the enabled vertical and horizontal leads, and then a single cell on each of the two selected chips is selected by utilizing row and column selectors in the manner previously described to apply vertical and horizontal control signals to the selected chips. The information stored in the two selected cells is then output through the respective sense amplifiers responsive to the HIGH state of lead MODEN1.

Thus, with reference to FIG. 3 decoder DEC18 is responsive to address bits 10–12 for providing an enable signal on one of the vertical leads V1–V8 and decoder DEC14 is responsive to address bits 13 and 14 for applying an enable signal to one of the horizontal leads H1–H4. For example, if leads V1 and H1 are enabled then chip X will be selected for access thereto and chip Y also be selected. Then, address bits 0–9 select the single cell on chips X and Y which is to be accessed. For a read operation, the desired information from cells X and Y will appear at the outputs designated BIT1 and BIT2 respectively. For a write operation, the data to be stored in the upper memory array is applied to lead DATA1 and the information to be stored in the lower memory array is applied to lead DATA2. The control circuitry is responsive to the state of lead READ/WRT which indicates whether a read or write operation is to be performed, as later discussed.

For a refresh operation, one row on each chip in the memory plane is refreshed at the same time. Thus, for example, the first row in chips X, Y, and each of the other chips will be refreshed at the same time. This refresh operation is performed responsive to the state of lead REF0 which will be discussed in greater detail hereinafter, and also responsive to predetermined states of address bits 10–14.

Figure 4:
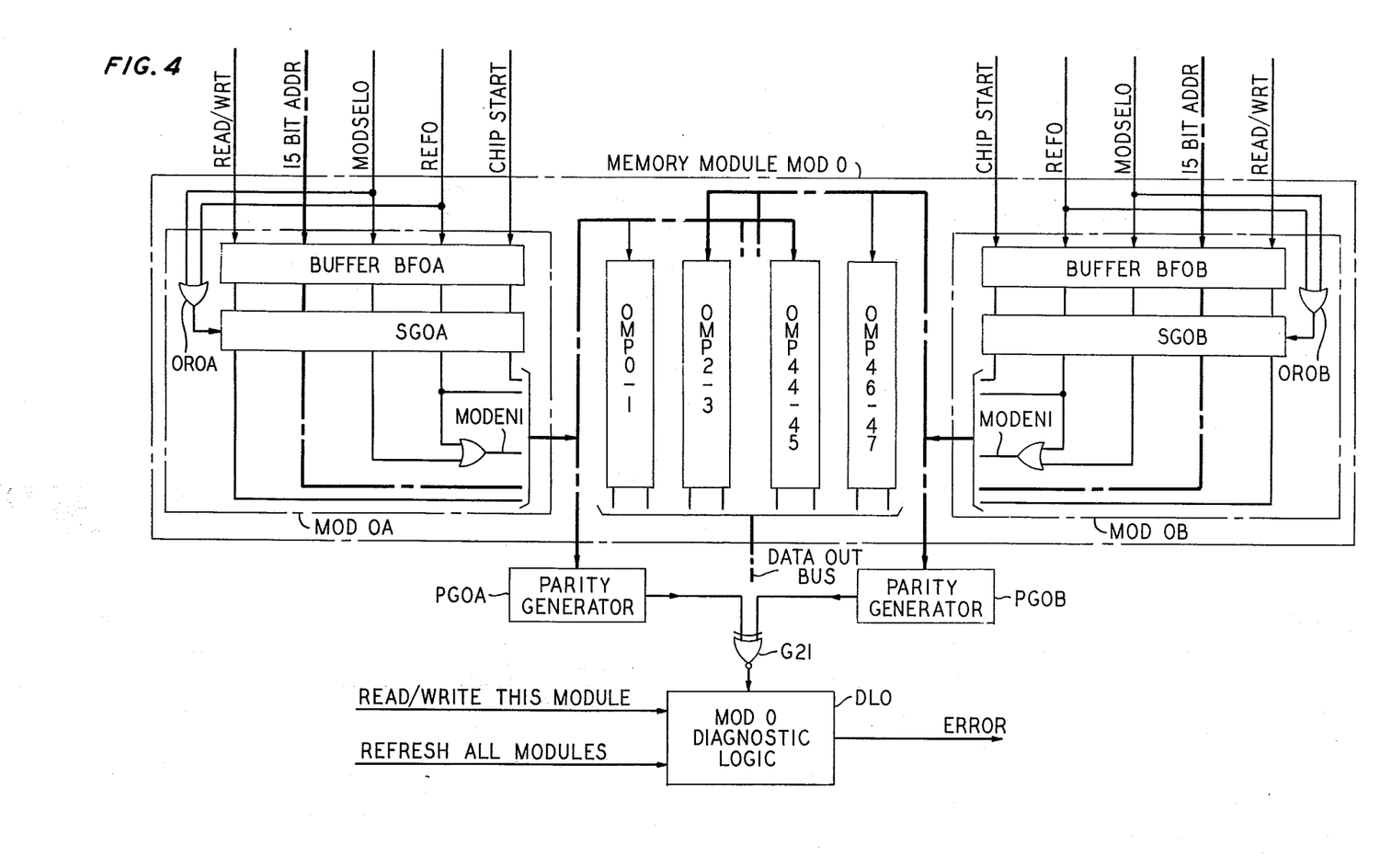
FIG. 4 illustrates in generalized form, diagnostic apparatus in accordance with one illustrative embodiment of our invention.

FIG. 4 illustrates how the memory planes shown in FIG. 3 are organized to form a complete memory module (MOD0). In the depicted arrangement, 24 memory planes are organized to store 32,768 48-bit words. Bit 0 and 1 or each word are stored in memory plane OMP0-1 and the last bits in each word, namely, bits 46, and 47 are stored in memory plane OMP46-47. Each of the memory planes is structurally identical to the plane shown in FIG. 3 including all decoders and other illustrated circuits as described above.

In one illustrative embodiment of our invention, the memory access circuitry is duplicated with each of the access circuits MOD0A and MOD0B controlling the access to specific ones of the memory planes. For example, it is seen that access circuit MOD0A controls the access to memory planes OMP0-1, OMP4-5, ... OMP44-45. Thus, circuit MOD0A controls the access to alternate memory planes. Access circuitry MOD0B controls the access to the remaining memory planes OMP2-3, OMP6-7, ... OMP46-47 in this one memory module.

The same control signals are simultaneously applied to both access circuits, so that each access circuit operates independently but concurrently to access the bits of the data word so that all 48 bits of the word at a specified address are retrieved at the same time and applied in parallel to cable DATAOUT. On the depicted figure it is seen that each of the input leads to the access circuits is duplicated. Thus, as described hereinafter, even though similarly designated leads are in fact independent leads, such leads are connected to a common signal source. For example, both leads designated CHIP START are connected to the ONE output of the same flip-flop as hereinafter explained. These independent leads are provided to facilitate fault detection in the equipment.

Both access circuits are responsive to (1) a read or write indication on lead READ/WRT (2) the 15-bit address of the designated word, (3) a module select signal which appears on lead MODSEL0 which indicates that the word is to be written into or retrieved from this memory module MOD0 rather than from another memory module (such as MOD1-5 as hereinafter described) which is also potentially responsive to the address, (4) a signal on lead REF0 which indicates that a refresh operation is required and (5) a signal on lead CHIP START which is a timing signal utilized to institute access to the module. All these signals will be described more fully hereinafter.

The information indicated by each of the abovementioned leads and cables is independently buffered in access circuits MOD0A and MOD0B by buffers BF0A and BF0B respectively. This information is then applied from the buffers to the respective symbolic gates SG0A and SG0B. Symbolic gate SG0A is representative of a plurality of AND gates equal in number to the number of leads extending through buffer BF0A, as indicated in FIG. 4. Each of these plurality of gates is responsive to the output of OR gate OR0A for gating through the information on the lead associated with that gate to the associated group of memory planes. Thus, responsive to a HIGH output from gate OR0A, symbolic gate SGDA applies to memory planes OMP0-1, OMP4-5, ... OMP44-45 all the buffered control signals, such as READ/WRT, MODSEL0, REF0, CHIP START and each of the fifteen address bits specified by cable 15 BIT ADDRESS. OR gate OR0A generates a HIGH output responsive to the HIGH states of either lead MODSEL0 or REF0. Lead MODSEL0 goes HIGH only when memory module MOD0 is accessed for a read or write operation and lead REF0 goes HIGH only during a refresh operation. Thus, during periods of nonaccess for MOD0, leads MODSEL0 and REF0 are both LOW and gate OR0A generates a LOW output inhibiting symbolic gate SG0A from applying any of the buffered information to the associated memory planes. While symbolic gate SG0A is inhibited, all output leads therefrom are clamped to a uniform predetermined LOW state. The above description in regard to gates OR0A and SG0A is equally applicable to gates OR0B and SG0B which perform the identical functions in access circuit MOD0B, and serve to control the application of control signals buffered by buffer BFOB to memory planes OMP2-3, OMP6-7, . . . OMP46-47. It should be noted that lead MODEN1, previously described in regard to FIG. 3, goes HIGH responsive to either the HIGH state of lead MODSEL0 or to the HIGH state of lead REF0 as output by symbolic gates SGOA and SGOB as shown in FIG. 4. As mentioned previously lead MODEN1 serves to control the gating out onto bus DATAOUT of the two bits retrieved from each of the memory planes.

In accordance with a feature of our invention, parity generator circuits PGOA and PGOB are provided to generate a parity indication over the outputs of access circuits MODOA and MODOB respectively. These parity indications are applied to EXCLUSIVE NOR gate G21 which continuously compares these parity indicators and generates a LOW output to module zero diagnostic logic DL0 when a mismatch is detected. Responsive to this mismatch, diagnostic logic then provides an error signal on lead ERROR if an indication is present on lead READ/WRITE THIS MODULE indicating that module MOD0 is being read or written at this time. This check beneficially serves to ensure that both access circuits are properly accessing the word at the same address.

Thus, for example, if circuit MODOA is indicating to its memory planes that the bits stored at a particular address are to be read, while circuit MODOB is indicating to its memory planes that the bits stored at another address are to be read, then generates PGOA and PGOB will generate different parity indications and gate G21 will detect a mismatch and so inform logic DL0 which then provides an error signal.

In accordance with still another feature of our invention, diagnostic logic DL0 is also responsive to refresh operations for detecting mismatches between the outputs of access circuits MODOA and MODOB. During refresh operations, circuits MODOA and MODOB should generate identical outputs to refresh the same row in each chip of every memory plane, and accordingly, a mismatch indicates a malfunction which might effect the viability of the stored information.

It should be noted that the parity generates are provided only to facilitate the comparison of outputs from the access circuits and these parity generators could be dispensed with in other embodiments and a straight comparison made of the outputs from the access circuits. However, in this one illustrative embodiment with duplicated access circuits, the comparison of parity signals has proven sufficiently reliable to dispense with a full comparison of output signals.

As discussed more fully hereinafter, the various input leads to diagnostic logic DL0 have been conceptually generalized in regard to FIG. 4 and represent the logical conditions actually indicated by combinations of other control leads.

SPECIFIC DESCRIPTION

Figure 7:
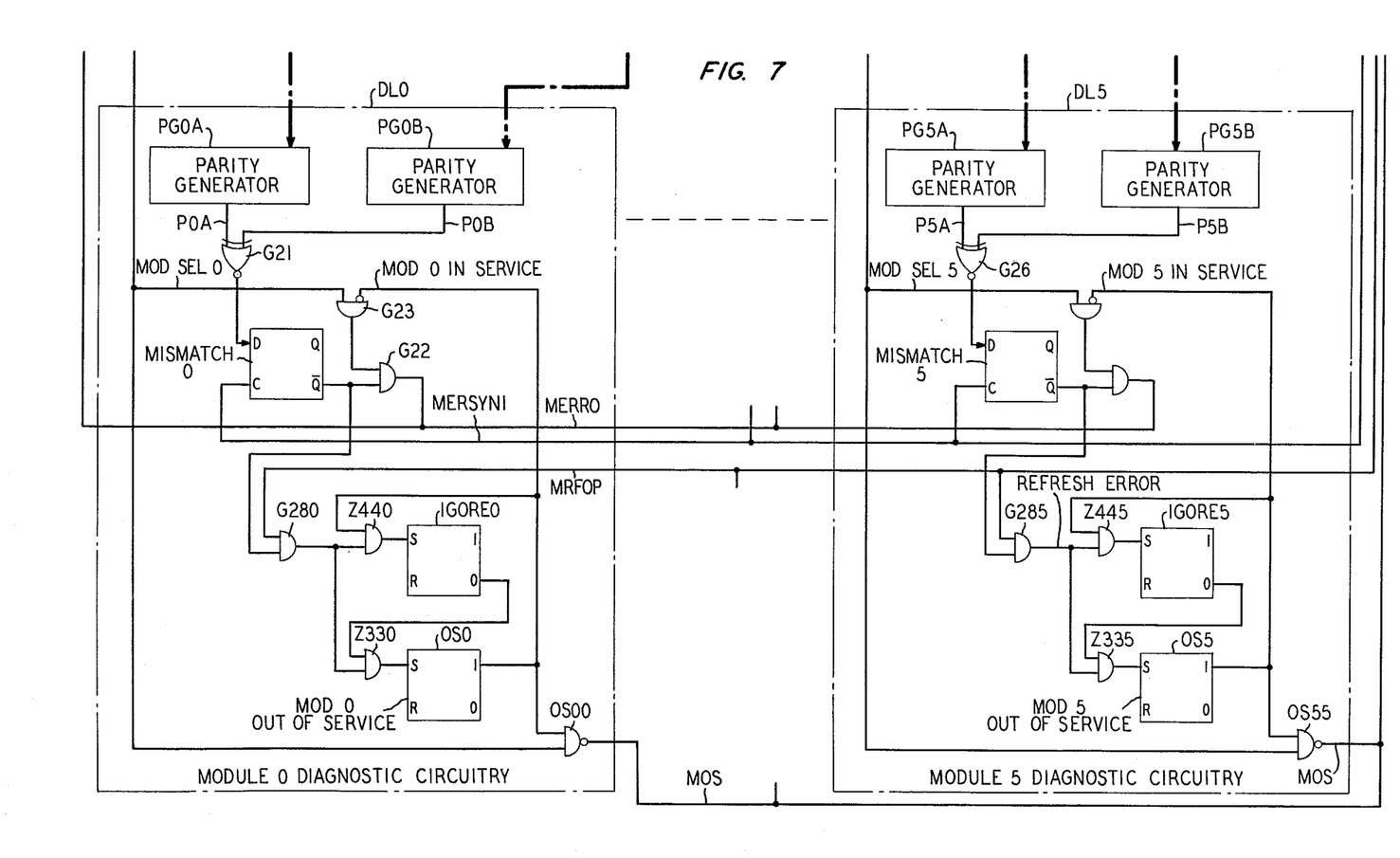
FIG. 7 illustrates the diagnostic circuitry utilized to detect malfunctions during read, write, and refresh operations on the memory modules.
Figure 8:
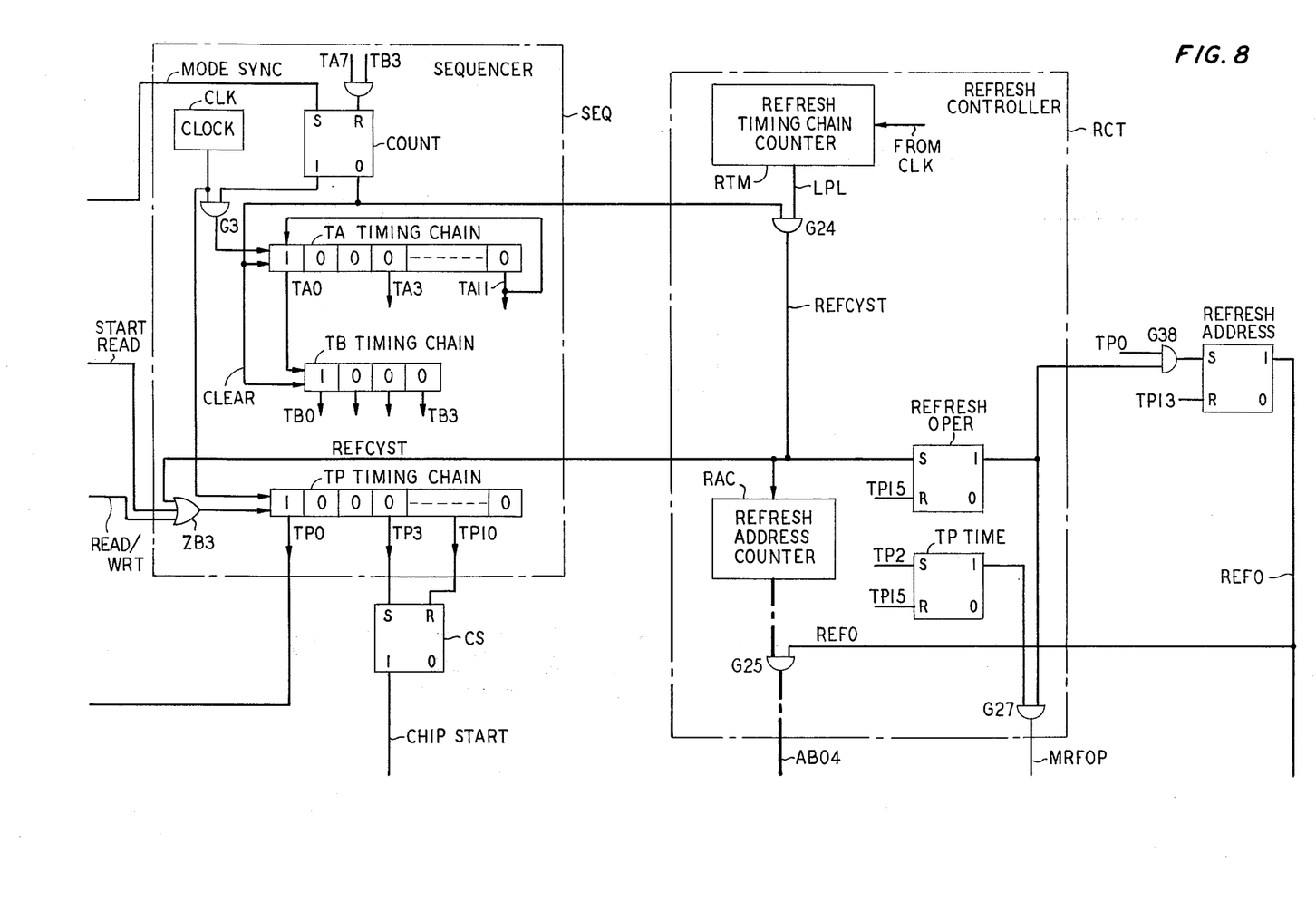
FIG. 8 illustrates timing circuits and circuitry for controlling the refresh operation on all modules.
Figures 9, 10:
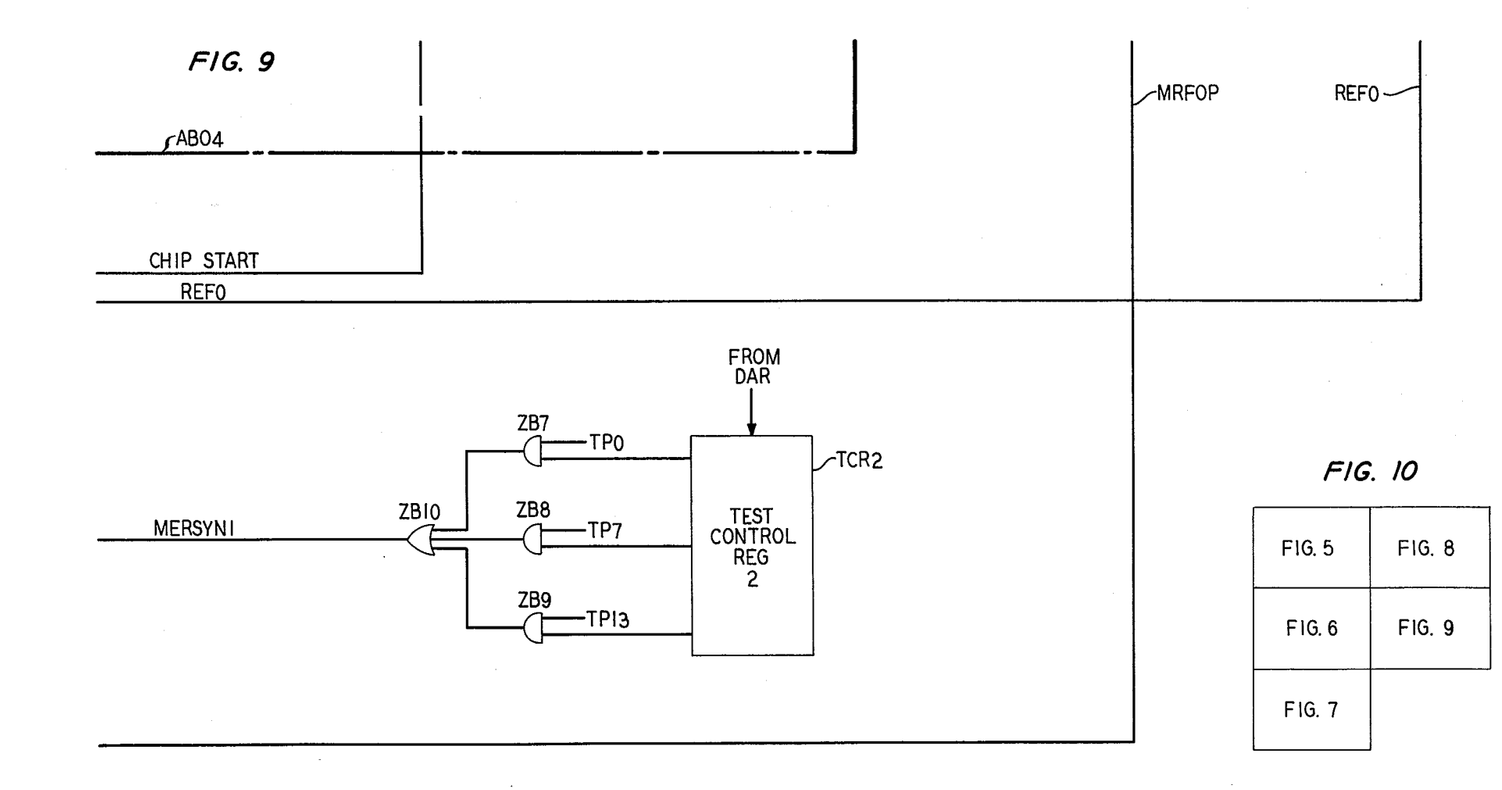

FIGS. 5–9 when arranged as shown in FIG. 10 illustrate the specific circuitry in the one illustrative embodiment of our invention previously generalized in regard to FIG. 4. This circuitry is utilized to access a plurality of memory modules designated MOD0-MOD5. Diagnostic circuitry is also described which operates in accordance with logic DL0 previously functionally described in regard to FIG. 4. However, now specific timing considerations are described and the interaction of diagnostic logic for each of the modules is also described. The circuitry in FIG. 4 corresponds to its similarly designated counterparts in FIGS. 5-8.

To facilitate an understanding of the operation of this circuitry, we will describe (1) how a read operation and the diagnostics associated therewith are performed, and (2) how a refresh operation and associated diagnostic checks are performed.

The entire IGFET memory system which is described below operates to store information which is utilized by data processor SPC shown in FIG. 5. This processor comprises duplicated processing units for performing logical and arithmetic operations on data in accordance with stored program instructions. Processor SPC is comprehensively described in Volume 49 of the *Bell System Technical Journal*, dated December 1970. This *Bell System Technical Journal* describes in some detail the interconnection between the SPC and a memory called a piggy-back twistor twistor memory. The IGFET memory described herein is designed to replace or, in some cases, augment existing piggy-back stores now in service. Thus, each IGFET memory module, which comprises sufficient memory for storing 32,768 words, will operate over existing data and address buses and will communicate with the SPC in a manner substantially identical to that utilized by the old piggy-back twister memories, which are described on page 2509 et seq. of the above-mentioned *Bell System Technical Journal*.

Figure 6:
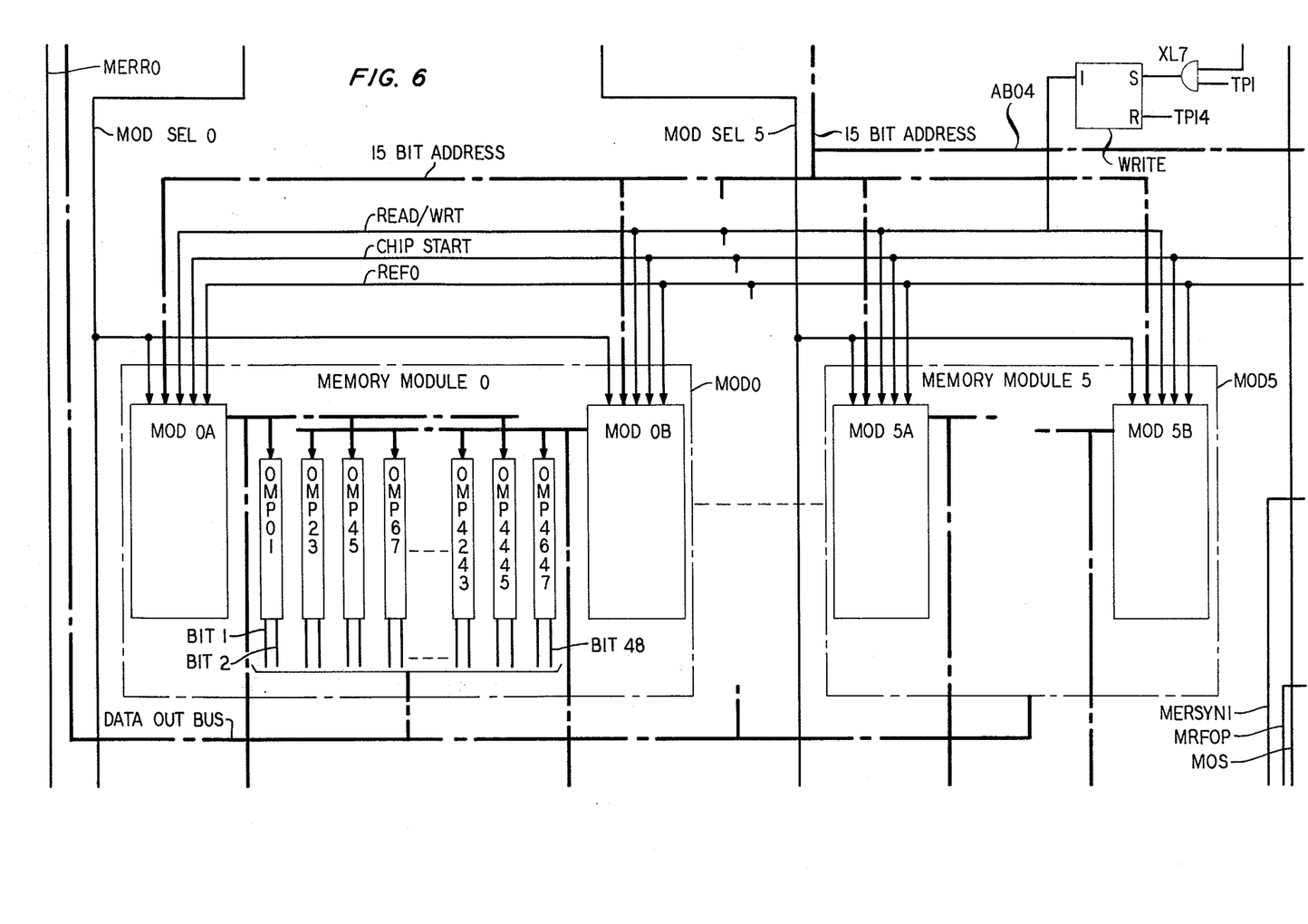
FIG. 6 illustrates how the memory planes shown in FIGS. 3 and 4 are organized to form various memory modules and also illustrates the duplicated access circuits utilized to control access to specified bits in the memory modules.

More specifically the SPC provides a high-going pulse on lead MODE SYNC in FIG. 6 to gate the mode bits of an instruction into the data-and-address register DAR in FIG. 6. Thus, lead MODE SYNC enables symbolic gate G1 to gate four MODE bits into register DAR. These MODE bits are applied to order decoder ORD which decodes the bits and generates a HIGH signal on one of its output leads to indicate the type of order to be executed. The different types of orders are read, write, control read, control write, and bus-register test. Read and write operations are used to access memory, the control read and control write operations are used to access control points in the memory system itself, such as test control registers and "out-of-service" flip-flops as described hereinafter, and the busregister test instructions check the store bus and data and address register. The SPC also provides an address sync pulse on lead ADDRESS SYNC to enable symbolic gate G2 to gate twenty address bits into register DAR.

The first six bits of the address specify a name code which identifies the particular memory module which is to be accessed and the next 14 bits plus one of the first 6 bits indicate the address of the word to be accessed within that module. The 6-bit name code is applied over cable C1 to circuits MAD0 through MAD5. Circuits MAD0-MAD5 are module administrative circuits and are respectively associated with modules MOD0-MOD5. Each memory module is identified by two different names. This is done merely for convenience since each of the new IGFET modules takes the place of two of the old piggy-back twistor memories.

Thus with reference to circuit MAD0 and module MOD0, this module is identified by two 6-bit names designated 0A and 0B. When the 6-bit name code applied over cable C1 matches one of the preset names, one of the comparators COMP0A or COMP0B in circuit MAD0 generates a HIGH signal on lead NAME MATCH thereby indicating that the associated module is to be accessed.

Thus, whenever one of the module administrative circuits detects that its associated module is to be accessed it applies a HIGH signal to common lead NAME MATCH.

Sequencer SEQ in FIG. 8 contains most of the timing circuitry utilized to control the gating of information in the memory system. More specifically, the MODE SYNC from the SPC also sets flip-flop COUNT and the ONE output of this flip-flop goes HIGH and enables gate G3 to gate the clock signals output from 10 MHz clock CLK to the TA timing chain. This timing chain is actually a shift register with 12 bit positions and is adapted to shift its contents every 100 nanoseconds responsive to the clock signals. It is assumed that a ONE was inserted into the first bit position on the the first clock pulse by well known circuitry not shown and that each of the other positions contained zeros.

For each clock pulse, the ONE is shifted into the succeeding bit position and the output lead associated therewith is enabled. Thus, for example, on the first clock pulse lead TA0 goes HIGH and then on the second clock pulse lead TA1 goes HIGH and so one until the single ONE is shifted into the last bit position and lead TA11 goes HIGH. Then on the next clock pulse, the ONE is recirculated back into the first bit position and the shifting continues.

A second timing chain called the TB timing chain is also provided and this chain shifts every 1.2 $\mu$s to provide a coarser time resolution than the TA timing chain. A one is inserted in the first stage of the register whenever lead TA0 goes HIGH. More specifically, the TB timing chain comprises a four-stage shift register which shifts each time lead TA0 goes HIGH. When the single ONE in this timing chain reaches the last-bit position (i.e., the position associated with output TB3), lead TB3 remains HIGH until time TA7, TB3 when the count flip-flop is cleared, which in turns sets the TA and TB timing chains to all zeros.

a. Read Operation

Figure 5:
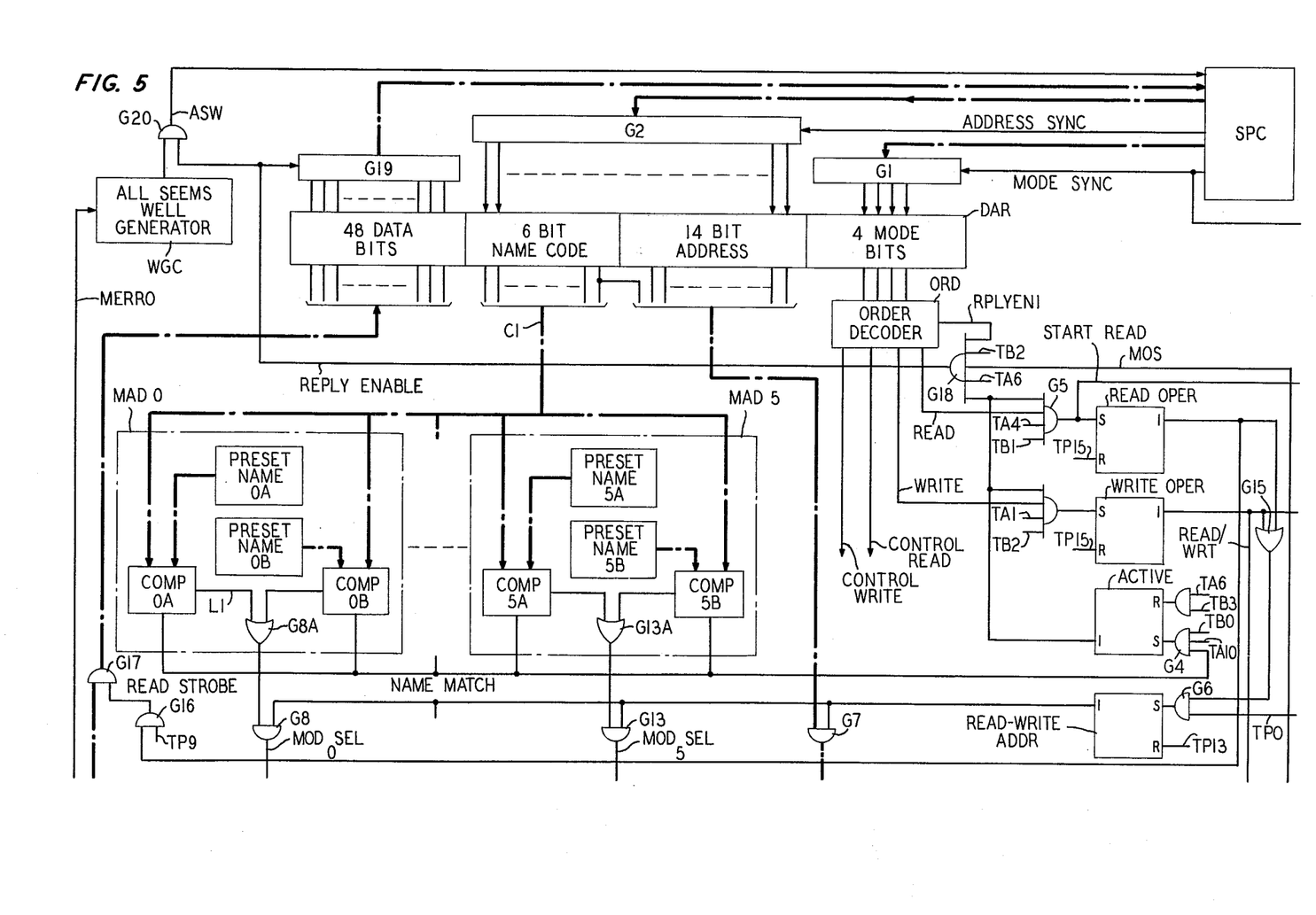
FIG. 5 illustrates control circuitry and data registers for providing communication between the memory modules and the data processing unit.

Returning now to the description of the read operation, at the time interval indicated by TB0 and TA10, gate G4 in FIG. 5, responsive to the HIGH state of lead NAME MATCH, generates a HIGH signal to set flip-flop ACTIVE. The ONE output of this flip-flop goes HIGH and applies a HIGH input to gate G5. This gate is also responsive to the HIGH states from lead READ from order decoder ORD and timing leads TA4 and TB1 for generating a HIGH output signal on lead START READ during the interval identified as TA4 and TB1. This signal sets flip-flop READ OPER. The START READ signal from gate G5 is also applied to the TP timing chain shown in FIG. 8 through OR gate ZB3. This timing chain is actually a 16-bit shift register which shifts its contents every 100 ns. Its operation is essentially identical to that described above in regard to the TB timing chains except it shifts responsive to clock CLK and clears itself by shifting the one out of its last bit position. Gate G6, responsive to the set stage of the read operation flip-flop (READ OPER) applied as the output of gate G15 and to a HIGH signal on timing lead TP0 at time TP0, generates a HIGH signal to set flip-flop READ-WRITE ADDR. The ONE output of this flip-flop goes HIGH to enable gate G7 in FIG. 5 to gate the 15-bit address from register DAR to each of the memory modules MOD0 through MOD5 and, more specifically, to the left and right access circuits in each module. Gate G7 is symbolic of 30 identical gates, two for each address lead. Thus, one lead for each bit extends to the left side access circuits in each module while a separate lead for each bit extends to the right side access circuits in each module. Similarly all leads to the module access circuits are duplicated. To simplify the drawing this lead duplication is not shown. The HIGH output of the READ-WRITE ADDR flip-flop is also applied to gates G8 through G13, which are respectively responsive to the outputs from circuits MAD0 through MAD5. If either of the comparison circuits in a module administration circuit had detected a name match, as described above, in addition to applying a HIGH signal to lead NAME MATCH, it would also apply a HIGH signal through a match gate such as G8A-G13A.

Thus, for example, if comparator COMPOA in circuit MAD0 detected a name match, it would apply a HIGH signal to lead L1 and through OR gate G8A to gate G8. Gate G8 would then generate a HIGH signal on lead MODSEL0 to indicate that the word at the 15-bit address was to be retrieved from module MOD0 and not from any of the other modules MOD1-MOD5. If circuit MAD5 had detected a name match, then gate G13 would have provided a HIGH signal on lead MODSEL5 to indicate to memory module MOD5 that it was to be accessed. Thus even though the 15-bit address is applied to all memory modules, only the module having an enabled MODSEL- lead is responsive to the address. At time TP3, lead TP3 is HIGH and sets flip-flop CS in FIG. 8. This flip-flop then generates a HIGH output on lead CHIP START, which lead extends to each of the memory modules and is utilized to indicate that access to a word in the memory can then be commenced. At TP10 flip-flop CS is reset and lead chip start goes LOW. In its idle state, the write operation flip-flop WRITE OPER in FIG. 5 is reset; and it is set only when a write order is to be executed. Since we are dealing with a read instruction now, the ONE output of this flip-flop is LOW and, accordingly, AND gate XL7 cannot set flip-flop WRITE, Lead READ/WRT, the ONE output of flip-flop WRITE, applies a LOW input to each of the memory modules indicating that a read operation is to be performed.

Assuming that a read operation is specified and lead MODSEL0 went HIGH to indicate module MOD0 was to be accessed, all the various input signals to module MOD0, and the 15 bit address are buffered in access circuits MOD0A and MOD0B. These circuits are identical to the similarly designated circuits previously described in regard to FIG. 4.

Thus, with reference to FIG. 7, it is seen that identical control and address information are applied to the left and right access circuits of module MOD0. Accordingly, both access circuits should operate simultaneously to access the 48-bit word stored at the 15-bit address specified. Here the left access circuit MOD0A controls the accessing of bits 0 and 1, 4 and 5, 8 and 9 . . . , 40 and 41, and 44 and 45. The remaining bits, namely 2 and 3, 6 and 7 . . . . and 46 and 47, are accessed by the right-hand access circuit MOD0B.

Thus, all 48 bits in the specified word module MOD0 are applied to bus DATAOUTBUS which is common to all the memory modules. As mentioned previously, the sense amplifiers, such as SA1 and SA2 in FIG. 3 are controlled by a lead such as MODEN1 to selectively apply information to the DATAOUTBUS from one module at a time.

Then, at TP9, gate G16 in FIG. 5 is enabled responsive to the HIGH state of lead TP9 and to the set state of the read operation flip-flop READ OPER. Thus gate G16 generates a HIGH signal on lead READ STROBE to enable symbolic gate G17 to gate the 48-bit word into register DAR. Then at time TA6 and TB2, gate G18 in FIG. 5 responsive (1) to the HIGH signal on leads TA6 and TB2; (2) to the set state of the active flip-flop ACTIVE; (3) to the HIGH state of lead RPLYEN1 from order decoder ORD signifying that the current operation should generate a reply; (4) to the HIGH state of lead MOS which indicates that the selected module is in service-as hereinafter explained; generates a HIGH signal on lead REPLY ENABLE. Symbolic gate G19 is responsive to this reply enable signal to gate the data back to the SPC. This reply enable signal also is utilized to gate an ALL SEEMS WELL signal back to the SPC over lead ASW. This ALL SEEMS WELL signal is generated only if the read operation passed certain diagnostic tests, as described below.

As mentioned previously, two parity generators are associated with each memory module for respectively indicating the parity over the outputs from the left and right access circuits in the associated module.

Thus, for example, parity generator PG0A is responsive to the output from circuit MOD0A for generating on lead P0A the parity over this output. Similarly, parity generator PG0B generates a parity indication on lead P0B responsive to the outputs from circuit MOD0B. These parity indications are compared by EXCLUSIVE NOR gate G21 which provides a LOW indication for any detected mismatches. This LOW indication can be gated into flip-flop MISMATCH0 at three time intervals namely TP0, TP7, and TP13.

More specifically, certain bits in test control register TCR2 in FIG. 9 are utilized to control which if any of the three timing pulses are utilized to perform a check. To elaborate, gates ZB7–ZB9 are respectively responsive to the signals on leads TP0, TP7 and TP13; and to three bits in register TCR2, to generate outputs which are applied to OR gate ZB10. For example, if these bits are all HIGH, then checks are performed at each of the three timing intervals. Gate ZB10 generates an output on lead MERSYN1 which extends to flip-flops MISMATCH0-MISMATCH5, to gate into these flip-flops any detected mismatches. Bits in registers TCR2 and TCR1 are administered via control write operations. Normally, TCR2 is configured to allow gating of mismatches at times TP0, TP7, and TP13. The presence of mismatch indications is monitored at three distinct timing points to ensure the continued operation of the access circuits throughout the access operation. More specifically, at TP0 a check is instituted to ensure that the outputs of the access circuits are clamped to their predetermined states prior to access. By TP7, all control signals should have been generated and applied by the access circuits to the memory module. Thus, the check at TP7 is to ensure that the module is properly accessed. Finally, at TP13 all control signals are present except the chip start signal. Thus, the third check is made toward the end of an access to allow examination of the turn off of the timing signals. Thus, in accordance with an aspect of our invention, the presence of mismatches is checked at various predetermined time intervals prior to and during the access operation.

Thus, if a mismatch is detected at any one of these time instances, the output of flip-flop MISMATCH0 designated $\overline{Q}$ will go HIGH to provide a HIGH input to gate G22. This gate is also responsive to a module active signal from gate G23 indicating that module MOD0 is active (lead MODSEL0 is HIGH) and is in-service (flip-flop OS0 is reset). Thus, if the error is detected in a read or write operation in which module MOD0 is in-service, then gate G22 generates a HIGH output signal on lead MERR0. This lead extends to ALL SEEMS WELL generator circuit WGC in FIG. 5 and responsive to the HIGH signal on lead MERR0, circuit WGC inhibits the generation of an ALL SEEMS WELL signal so that when the word read from memory is returned to the SPC as previously described, an ALL SEEMS WELL signal will not be provided. This indicates to the SPC that a problem has been detected in the memory and that the word just read from memory should not be used because it may contain errors.

The preceding has described how the depicted circuitry is controlled to perform a read operation and how diagnostic comparisons are instituted between the outputs of the access circuits in the accessed module to verify the integrity of the read operation. During a write operation, identical comparisons are instituted between the outputs of the access circuits in the accessed modules in a manner so substantially identical to that described above that further discussion of write operation beyond previous discussion of the write operation in regard to FIG. 2 is not deemed necessary.

b. Refresh Operation and Diagnostics Associated Therewith

In this dynamic storage medium because of the volatile nature of the stored information, all stored information must be periodically refreshed. In this illustrative embodiment, every 60 $\mu$s one row in each chip is refreshed, as described previously. Thus, 32 cycles are required to refresh the entire memory and all six memory modules MOD0-MOD5 are refreshed simultaneously.

In accordance with a feature of our invention, the refresh operation is utilized as a diagnostic tool to verify that the access circuits associated with each memory module are operating correctly. More specifically, for each refresh operation, a parity comparison is made between the control signals output from the right and left access circuits for each module. Thus, even in the absence of a read or write access to a memory module, the operability of the access circuits therein are still diagnosed at relatively frequent time intervals.

FIG. 8 illustrates refresh controller RCT which generates the various timing and control signals to control the performance of the periodic refresh operations. More specifically, refresh timing counter RTM is provided for generating a HIGH pulse on lead LPL every 60 us. Responsive to this HIGH signal if the count flip-flop COUNT in FIG. 8 is reset, gate G24 generates a HIGH output signal on lead REFCYST to indicate the start of a refresh cycle.

As mentioned previously, the count flip-flop COUNT is set when either a read or write access is being instituted in one of the memory modules. Thus if the count flip-flop is set, the refresh operation is temporarily delayed to avoid interference with the read or write operation. Adequate time is reserved between memory accesses to perform one refresh operation. The circuitry for avoiding these conflicts is well known and is not described any further herein. However, for further reference to arrangements for avoiding these conflicts J. A. Reed U.S. Pat. No. 3,858,185, issued Dec. 31, 1974, and S. B. Behman U.S. Pat. No. 3,810,129, issued May 7, 1974, may be consulted.

The HIGH output from gate G24 on lead REFCYST is also applied to refresh address counter RAC to increment the present count therein. Counter RAC is a binary counter for counting from 0–31 to indicate the particular row of cells in each chip which is to be refreshed. Thus, at 60 us intervals successive rows of cells are refreshed with the identity of the row to be refreshed being indicated by counter RAC. The HIGH state of lead REFCYST is also applied to the TP timing chain in FIG. 8 through gate ZB3 to restart the chain to institute the timing necessary for a refresh memory access. The use of this chain was previously described in regard to a read operation. The HIGH signal on lead REFCYST also sets flip-flop REFRESH OPER which in turn allows flip-flop REFRESH ADDRESS to be set at time TPO by gate G38. The ONE output of this flip-flop is designated REFO which extends to all memory modules and when HIGH indicates a refresh operation is to be performed. GATE G25 is enabled by the HIGH state of lead REFO to apply the row count indicated by counter RAC over cable ABO4 to the 15 bit address cable and then to each of the access circuits MOD-A and MOD-B in each of the memory modules MOD0-MOD5. The output of counter RAC now indicates address bits 0–4 to the modules and serves to select the row of cells which is to be refreshed in every chip therein.

The refresh operation is instituted in a manner substantially identical to that described previously in regard to FIGS. 2 and 3 except that cells in each chip in the entire memory are refreshed concurrently. In accordance with a feature of our invention, each of the parity generator circuits such as PG0A, PG0B, . . . PG5A, and PG5B generates a parity bit over their respective output leads based upon the control signals applied thereto from the associated access circuits. In a manner identical to that previously described in regard to a read operation, gate G21 in FIG. 7 and corresponding gates such as G26 in each of the other modules generate a LOW output if a mismatch is detected between the two parity indications applied thereto. This serves to reset the respective mismatch flip-flops associated with each module if a mismatch is detected, as described below.

For example, if during a refresh operation, access circuits MOD5A and MOD5B erroneously generate different access signals for memory module MOD5, then parity generators PG5A and PG5B should apply different parity indications to gate G26. Then, at the various time intervals such as TP0, TP7, and TP13 as indicated over lead MERSYN1, the LOW output from gate G26 is stored in flip-flop MISMATCH5.

The HIGH output from gate G24 in FIG. 8 on lead REFCYST also serves to set the refresh operation flip-flop REFRESH OPER, as described above, which applies a HIGH output to gate G27 in FIG. 8. This gate is also responsive to the ONE output of flip-flop TP TIME in FIG. 8. This flip-flop is set at TP2 and reset at TP15. Thus, during this time interval the ONE output of this flip-flop is HIGH applying a HIGH input signal to gate G27. Thus, gate G27 generates a HIGH output signal on lead MRFOP from time TP2 to TP15 during refresh operations. Lead MRFOP extends to the diagnostic circuitry in FIG. 7 for each of the memory modules and more specifically to gates G280 through G285 therein.

These gates are also responsive to the $\overline{Q}$ output from their respective mismatch flip-flops. Thus, for example, if flip-flop MISMATCH5 was reset at TP7 indicating the detection of a mismatch, then its $\overline{Q}$ output would apply a HIGH input to gate G285 which would then generate a HIGH output on lead REFRESH ERROR. This signal indicates that an error has been detected in the access circuits during a refresh operation. IGORE5

The HIGH state of lead REFRESH ERROR passes through OR gate G29 to gate Z445. If MOD5 is in-service then the ONE output of flip-flop OS5 will be LOW and, accordingly, gate Z445 will generate a LOW output and not set flip-flop IGORE5. However, the HIGH state of lead REFRESH ERROR and the reset state of flip-flop IORE5 enables gate Z335 to generate a HIGH output to set flip-flop OS5 thereby taking MOD5 out of service. Flip-flop OS5 therefore can indicate that an error has been detected during a refresh operation by setting the module out of service. The ONE output of OS5 and the ONE state of REFRESH ERROR will then set IGORE5. When a particular module is taken out-of-service, new information can be written into the module but the module cannot be read in the normal manner. To elaborate, NAND gate OS55 generates a LOW output on lead MOS responsive to the HIGH state of lead MODSEL5 and the HIGH state of the one output of flip-flop OS5. Thus, when a selected module is out of service, lead MOS goes LOW to inhibit gate G18 in FIG. 5 from allowing a response the next time module MOD5 is accessed for a read or write operation. Similar circuitry in each other module controls the state of lead MOS in a manner identical to that described above. A control write operation can be utilized to set or reset the module out of service OS- and IGORE- flip-flops.

What is claimed is:

1. For use in a memory system wherein a memory module stores a plurality of words, and wherein a source of address information indicates the address of a word to be accessed in said memory module, diagnostic apparatus comprising first access means responsive to said address information for providing a plurality of control signals to control said memory module to access predetermined bits of said addressed word, second access means responsive to said address information for providing a plurality of control signals to control said memory module to access the remaining bits of said addressed word, means connected to both said access means for comparing the control signals provided by said first access means with the control signals provided by said second access means, and means responsive to said comparing means for generating an error indication if said control signals mismatch.

2. The diagnostic arrangement in accordance with claim 1 wherein said comparing means comprises first parity generator means for providing a first parity indication over the control signals provided by said first access means, second parity generator means for providing a second parity indication over the control signals provided by said second access means, and means for comparing said first and second parity indications.

3. For use in a memory system having a memory module for storing information, which information must be periodically refreshed within a predetermined time interval to maintain the viability of the information, and means for providing a refresh signal indicating that a refresh operation is to be commenced and for providing an address identifying a group of locations in said module containing information which is to be refreshed, a diagnostic arrangement comprising first access means responsive to said refresh signal and to said address for applying control signals to said module to control said module to restore the information stored in certain of said identified group of locations, second access means responsive to said refresh signal and to said address for applying control signals to said module to control said module to restore the information stored in the remaining of said identified group of locations, means connected to said access means for comparing the control signals provided by said first access means with the control signals provided by said second access means, and means responsive to said comparing means for generating an error indication if said control signals mismatch.

4. For use in a memory system wherein a memory module storing a plurlity of words comprises a plurality of memory planes including decoder circuits, each of said memory planes storing a predetermined number of bits of each of said words, a diagnostic arrangement comprising means for providing address information identifying a word, first buffer means connected to certain of said memory planes and responsive to said address information for providing control signals to said certain memory planes to control each of said certain memory planes to access said predetermined number of bits of said identified word stored therein, second buffer means connected to the remaining ones of said memory planes and responsive to said address information for providing control signals to said remaining planes to control each of said remaining planes to access said predetermined number of bits of said identified word stored therein, and means for comparing said control signals provided by said first buffer means with said control signals provided by said second buffer means, and for providing an error signal if said control signals mismatch.

5. A diagnostic arrangement for ascertaining whether a memory is being properly accessed comprising control means for providing control information including an address identifying one of the words stored in said memory, first access means responsive to said control information for generating and then applying a first set of signals to said memory to access predetermined bits of said one word, second access means concurrently responsive to said control information for generating and applying a second set of signals to said memory to access the remaining bits of said word, first parity generating means for computing parity over said first set of signals.

second parity generating means for computing parity over said second set of signals, and means for comparing said parities computed by first and second parity generating means and for providing an error signal if a mismatch is detected.

6. The arrangement in accordance with claim 5 wherein said memory comprises a plurality of memory planes each storing one or more bits of each of the words in said memory, and wherein said first set of signals is applied to predetermined ones of said memory planes and wherein said second set of signals is applied to the remaining ones of said memory planes.

7. The arrangement in accordance with claim 5 wherein said first access means and said second access means each comprise buffer means for temporarily storing said control information and logic means for logically combining some of said control information to generate new control information; and wherein said first and second sets of signals each comprise said new control information and at least some of said control information.

8. The arrangement in accordance with claim 7 wherein said control means changes said control information during the accessing of said one word and wherein said arrangement further comprises timing means for providing timing signals at distinct timing intervals during the accessing of said one word and wherein said comparing and error signal providing means generates said error signal only at said distinct timing intervals jointly responsive to said timing signals and to the detection of a mismatch.

9. A diagnostic arrangement for ascertaining whether a memory comprising a plurality of volatile storage elements is being properly accessed for refreshing the information stored in said storage elements, which comprises control means for providing control information including an address identifying a group of said storage elements which are to be refreshed, first access means responsive to said control information for generating and applying a first set of signals to said memory to refresh the information stored in predetermined ones of said storage elements in said group, second access means concurrently responsive to said control information for generating and applying a second set of signals to said memory to refresh the information stored in the remaining ones of said storage elements in said group, first parity generating means for computing parity over said first set of signals, second parity generating means for computing parity over said second set of signals, and means for comparing said parities computed by said first and second parity generating means and for generating a mismatch signal when said parities do not match.

10. The arrangement in accordance with claim 9 further comprising a source of timing signals defining distinct timing intervals during the refreshing of said group of storage elements, means jointly responsive to said timing signals and to said mismatch signal for generating an error signal each time said mismatch signal is present during one of said distinct timing intervals, and logic means responsive to said error signal for providing an indication that said memory is out-of-service.

11. The arrangement in accordance with claim 10 further comprising inhibiting means responsive to said out-of-service indication for inhibiting the transfer of information read from said memory.

12. The arrangement in accordance with claim 10 further comprising register means for storing indicia specifying said time intervals at which said error signal can be generated, and wherein said error signal generating means includes logic means responsive to said stored indicia for inhibiting the generation of said error signal during time intervals other than those specified by said stored indicia.

* * * * *

UNITED STATES PATENT AND TRADEMARK OFFICE
CERTIFICATE OF CORRECTION

PATENT NO. : 3,944,800
DATED : March 16, 1976
INVENTOR(S) : Frank Valentine Beck, David Cartwright Peterson, Edward Myron Prell and Terrence Thomas Quin It is certified that error appears in the above-identified patent and that said Letters Patent are hereby corrected as shown below:

```
Column  2, line  5, "acess" should read --access--.
Column  2, line 27, "(e.g. bits 2, 3, 5, 7 ... 46, 47)"
should read --(e.g. bits 2, 3, 6, 7 ... 46, 47)--.
Column  2, line 39, "out" should read --our--.
Column  2, line 41, "compared" should read --"compared"--.
Column  2, line 53, "compared" should read --"compared"--.
Column  2, line 63, "compared" should read --"compared"--.
Column  5, line 58, "Bit" should read --Bits--.
Column  5, line 59, "or" should read --of--.
Column  7, line 30, "generates" should read --generators--.
Column  7, line 43, "generates" should read --generators--.
Column 14, line  8, delete "IGORE5".
Column 14, line 15, "IORE5" should read --IGORE5--.
Column 15, line 26, "plurlity" should read --plurality--.
```

Signed and Sealed this twenty-ninth Day of June 1976

[SEAL]

Attest:

RUTH C. MASON
Attesting Officer

C. MARSHALL DANN
Commissioner of Patents and Trademarks